United States Patent
Wada et al.

(10) Patent No.: US 6,488,984 B1
(45) Date of Patent: Dec. 3, 2002

(54) FILM DEPOSITION METHOD AND APPARATUS

(75) Inventors: Yuichi Wada, Narita (JP); Hiroyuki Yarita, Narita (JP); Hisashi Aida, Narita (JP); Naomi Yoshida, Narita (JP)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/830,633

(22) PCT Filed: Oct. 29, 1999

(86) PCT No.: PCT/JP99/06049

§ 371 (c)(1),
(2), (4) Date: Apr. 30, 2001

(30) Foreign Application Priority Data

Dec. 29, 1998 (JP) ............................................. 10-308668

(51) Int. Cl.[7] .............................. B05D 3/02; B05D 1/02; C23C 14/34; B05B 3/00; B05B 7/00
(52) U.S. Cl. ..................... 427/229; 427/383.1; 427/384; 427/421; 204/192.12; 204/298.25; 118/50; 118/58; 118/300; 118/323
(58) Field of Search ............................. 427/229, 383.1, 427/384, 421; 204/192.22, 192.12, 298.25; 118/50, 300, 58, 323

(56) References Cited

U.S. PATENT DOCUMENTS 4,951,601 A * 8/1990 Maydan et al. ............. 118/719
6,056,864 A * 5/2000 Cheung ...................... 205/222
6,245,663 B1 * 6/2001 Zhao et al. .................. 438/622

FOREIGN PATENT DOCUMENTS

| JP | 62-120475 | 6/1987 | ........... C23C/16/44 |
|---|---|---|---|
| JP | 63-125681 | 5/1988 | ........... C23C/16/54 |
| JP | 04-053132 | 2/1992 | ......... H01L/21/288 |
| JP | 04/080363 | 3/1992 | ........... C23C/16/06 |
| JP | 05-315336 | 11/1993 | ....... H01L/21/3205 |
| JP | 07-267621 | 10/1995 | ........... C01B/33/02 |
| JP | 09-45773 | 2/1997 | ......... H01L/21/768 |
| JP | 09-069522 | 3/1997 | ....... H01L/21/3205 |
| JP | 09-302471 | 11/1997 | ........... C23C/16/18 |
| JP | 10/135154 | 5/1998 | ......... H01L/21/285 |
| JP | 10-140352 | 5/1998 | ........... C23C/16/18 |
| JP | 11-001778 | 1/1999 | ........... C20C/18/08 |

* cited by examiner

*Primary Examiner*—Steven H. VerSteeg
(74) *Attorney, Agent, or Firm*—McDermott, Will & Emery

(57) ABSTRACT

The present invention is directed to a film deposition method, which performs one series of processing from formation of the barrier metal up to and including formation of the metal layer in an environment cut off from air. Specifically, the performing of the barrier metal layer formation in a first device and the metal layer formation in a second device; and the transport of a semiconductor wafer from the first device to the second device is performed through a transport pathway that is cut off from air. As a result, the barrier metal layer that is formed is not affected by, for example, natural oxidation and layer quality is improved.

17 Claims, 5 Drawing Sheets

FILM DEPOSITION METHOD AND APPARATUS

TECHNICAL FIELD

The present invention relates to the process of manufacturing a semiconductor device. In particular, it relates to techniques of forming a metal film onto a to-be-processed body such as a semiconductor wafer.

BACKGROUND ART

In recent years, the demand for increased integration and miniaturization of semiconductor devices in semiconductor device manufacturing processes has become stronger, and in order to respond to those demands, there has been a considerable shift from using aluminum as the interconnect material or line material in film deposition processes to using copper or gold, which have lower resistance.

Currently with the metalorganic chemical vapor deposition (MOCVD) processes have been put into use, an organic metal that is liquid at room temperature and under normal pressure such as $(hfac)Cu^{+1}(tmvs)$ is vaporized and introduced into a process chamber, and a copper film is deposited while causing a pyrolytic decomposition reaction to occur on the wafer that is being held inside the process chamber.

Processes that are also given consideration involve applying the organic metal as it is or mixed with an organic solvent (an organometallic fluid) onto the wafer while heating the wafer that has been placed in the process chamber, and then causing a pyrolytic decomposition reaction to occur in order to form the metallic film.

Incidentally, when forming a metallic film such as copper, since there is a possibility that some atoms of the metal may disperse to the under layer, a barrier metal layer such as tantalum or tantalum nitride has conventionally been formed before depositing the metal film.

However, even if this type of barrier metal layer has been formed, problems tend to develop such as either the ohmic value of the metal film showing a value that is higher than the desired value, or the adhesion of the metal film being low.

The object of the present invention is to provide a method of film deposition, and an apparatus thereof, that can perform film deposition of a metallic film without having the problems described above.

DISCLOSURE OF THE INVENTION

In order to reach this objective, the inventors considered many variables. As a result, they concluded that the barrier metal layer might be affected by factors such as natural evaporation since the wafer is conventionally exposed to air after the barrier metal layer is formed.

Accordingly, the present invention is a film deposition method that forms a metal layer after forming a barrier metal layer on a to-be-processed body; wherein one series of processing from formation of the barrier metal up to and including formation of the metal layer is performed in an environment cut off from air.

More specifically, the performing of the barrier metal layer formation in a first device and the metal layer formation in a second device; and the transport of a to-be-processed body from the first device to the second device is performed through a transport pathway that is cut off from air.

In addition, it is preferable that the metal layer formation comprise a first step of preparing an organometallic fluid, which contains an organic metal such as $(hfac)Cu^{+1}(tmvs)$ as its main component and which precipitates a metal layer material through a pyrolytic decomposition reaction, and then applying the organometallic fluid onto the to-be-processed body at a temperature within the non-reactive range of the organic metal; and a second step of heating the to-be-processed body to a predetermined temperature after the first step, and causing a pyrolytic decomposition reaction of the organic metal within the fluid that is applied to the to-be-processed body. In this manner, by performing application and heating separately, it is possible to apply a film having even layer thickness and quality; and in addition since it is possible to cause a pyrolytic decomposition reaction to occur throughout the surface, a metal layer may be obtained having superb layer thickness and quality throughout its surface.

Moreover, it is preferable that, after formation of barrier metal layer, a thin film of the same metal material as that of the metal layer be formed on the barrier metal layer as a seed layer.

The film deposition apparatus that embodies the film deposition method of the present invention is most effective when it comprises a first device, which forms a barrier metal layer in an environment that is cut off from air; a second device, which forms a metal layer in an environment that is cut off from air; and a transport pathway, which connects the first device and the second device, and is cut off from air.

It is preferred that this film deposition apparatus further comprise a third device that forms a thin layer made of the same metal material as that of the metal layer, as a seed layer in an environment cut off from air.

The above and other features and advantages of the present invention will become more apparent from the following detailed description to those skilled in the art, when taken in conjunction with the accompanying drawings.

BEST MODE FOR CARRYING OUT THE INVENTION

Figure 1C:
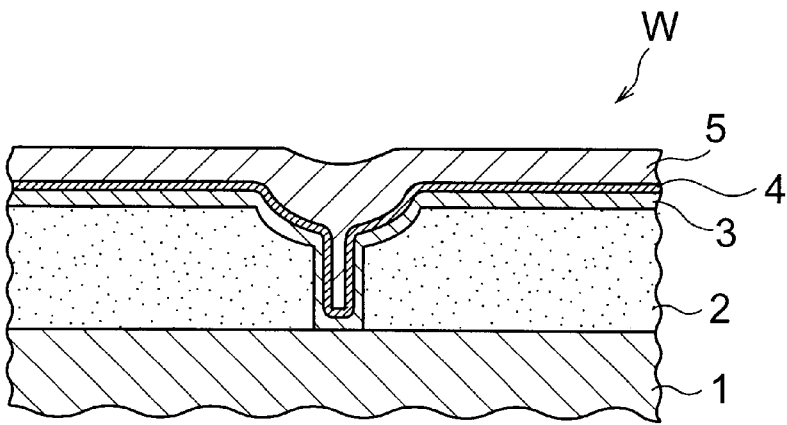
Figure 2:
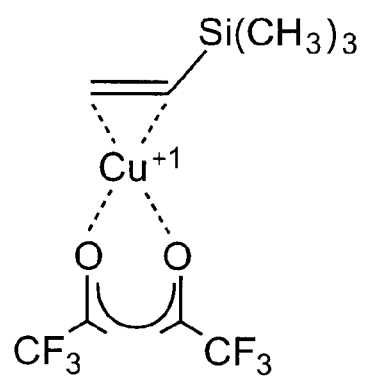
FIG. 2 illustrates the constitutional formula of $(hfac)Cu^+{}_1(tmvs)$.

The preferred embodiments of the present invention will now be described while referencing the attached Figures. It is noted here that, as shown in FIG. 1c, the case of forming thin film 3 as a barrier metal layer from a material such as tantalum (Ta), tantalum nitride (TaN), titanium nitride (TiN) or tungsten nitride (WN), on the semiconductor wafer (tobe-processed body) W that has insulating layer 2, such as a silicon oxide film ($SiO_2$), formed on copper interconnect layer 1, then depositing copper thin film 5 is assumed, with the organic metal $(hfac)Cu^{+1}(tmvs)$ assumed to be the base material of copper layer 5. The constitutional formula of $(hfac)Cu^{+1}(tmvs)$ is shown in FIG. 2, and is in its liquid state at room temperature and under normal pressure. Since the viscosity of $(hfac)Cu^{+/}(tmvs)$ is low, it may be applicable for use as it is in film deposition method of the present invention; however, in the following embodiments, it is mixed with the organic solvent heptadecane for greater ease in handling. Hereafter, the fluid that contains this $(hfac)Cu^{+1}(tmvs)$ is referred to as "process fluid".

Figure 3:
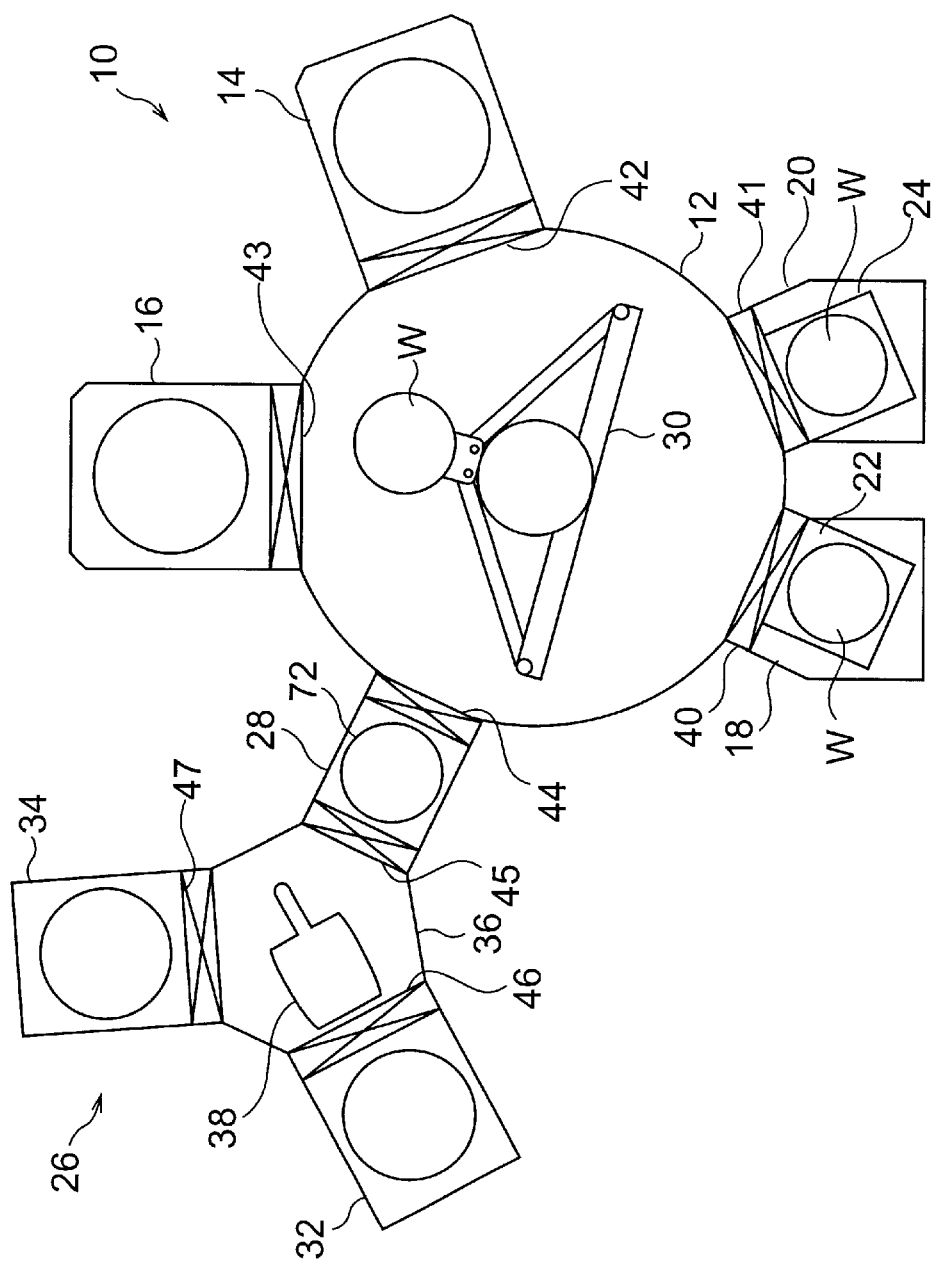
FIG. 3 is an abbreviated explanatory diagram showing the first embodiment of the film deposition apparatus according to the present invention.

FIG. 3 is a schematic diagram showing the first embodiment of film deposition apparatus 10 according to the present invention. This film deposition apparatus 10 is multi-chambered, and comprises first transfer chamber (transport pathway) 12, which maintains a predetermined degree of vacuum inside; and first process chamber 14 and second processing 16, which are configured around the periphery of first transfer chamber 12. First process chamber 14 has structured a sputtering device (first device) for forming the barrier metal layer, and second process chamber 16 has structured a sputtering device (third device) for forming a seed layer. Load lock chambers 18 and 20 are also connected around the periphery of first transfer chamber 12, and these load lock chambers 18 and 20 are configured in a manner such that cassette holders 22 and 24, which hold a plurality of wafers W, may be installed from the outside. In addition, copper film deposition device (second device) 26, which performs film deposition by applying the process fluid onto wafer W and then causing a pyrolytic decomposition reaction of the organic material within the process fluid to occur in order to deposit the copper film, is connected to first transfer chamber 12 via the small capacity buffer chamber 28. Transport robot 30 is provided in first transfer chamber 12, and each of the chambers 12, 14, 16, 18, 20 and 28 are configured such that wafer W may be transferred between them without being exposed to air.

Copper film deposition device 26 comprises third process chamber 32, which performs the process of applying process fluid onto wafer W; fourth process chamber 34, which performs the process of pyrolytically decomposing the organic metal, namely $(hfac)Cu^{+1}(tmvs)$; and second transfer chamber 36, which is configured between both of chambers 34 and 32. Within second transfer chamber 36, there is also provided transport robot 38, making it feasible for wafer W to be transferred among chambers 28, 32, 34, and 36.

It is noted here that reference numerals 40 to 47 denote slit valves that open and close the wafer transport pathways between the chambers.

With film deposition apparatus 10 having this manner of over-all construction, the first process chamber 14 comprises a film deposition device, for example a sputtering device not specifically shown in the Figures, which is a conventionally well known device that uses a target material for the barrier metal layer, for example tantalum. In addition, second process chamber 16 also comprises a film deposition device, for example a sputtering device that is also not specifically shown in the Figures, which is a conventionally well known device that uses copper as a target material.

Figure 4:
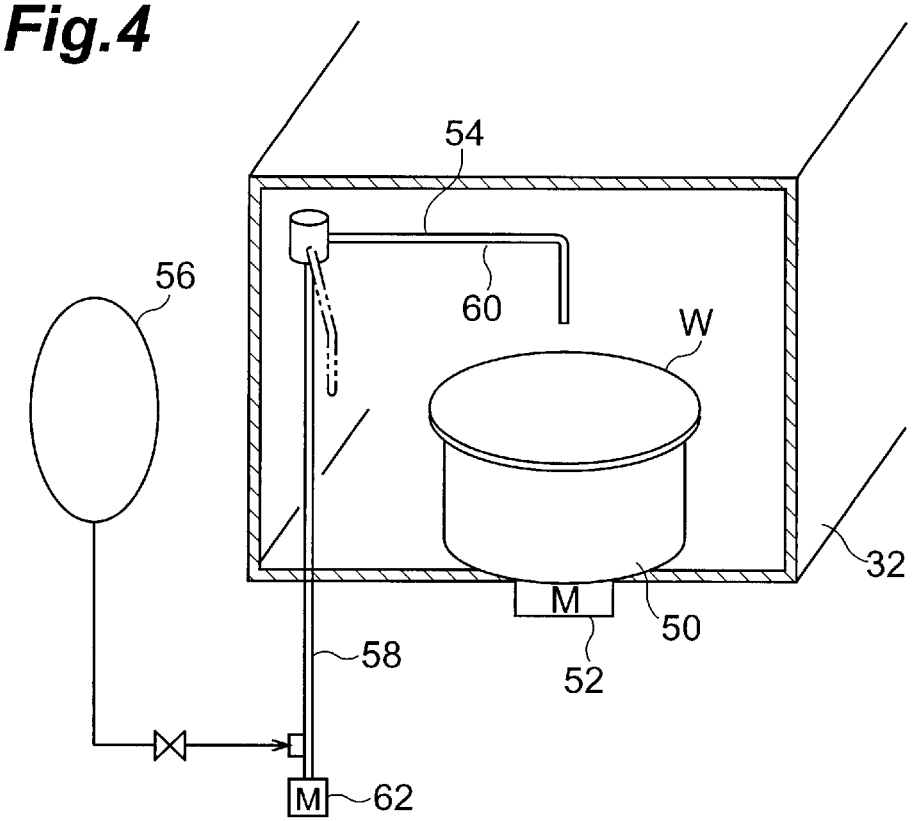
FIG. 4 is a schematic diagram showing the process chamber used for application in the copper film deposition apparatus of FIG. 3.

On the other hand, as shown in FIG. 4, turntable 50 is configured within third process chamber in copper film deposition device 26 to support wafer W. Wafer W is placed horizontally on this turntable 50 and held in place using an appropriate fixing means such as a vacuum chuck, which is not shown in the Figure. The diameter of turntable 50 is shown in the Figure smaller than the diameter of wafer W; however, when the diameter of turntable 50 is larger than that of wafer W, not only does the process fluid adhere to wafer W, but also to the exposed portions of turntable 50, which can have negative repercussions for the next wafer W to be processed. Turntable 50 further comprises drive motor 52, which is configured external to third process chamber 32 in a manner that allows it to rotate turntable 50 at relatively high speeds.

Also within third process chamber 32, application device (application means) 54 is provided in order to apply process fluid to the surface of wafer W. Application device 54 comprises supply pipeline 58, which introduces process fluid from process fluid supply system (supply means) 56, which is configured external to third process chamber 32; and nozzle 60, which extends horizontally from the upper end of supply pipeline 58 and its end facing downward. Supply pipeline 58 is configured so that it may be rotationally driven both backwards and forwards by actuator 62, which may be, for example, a drive motor, and because of this nozzle 60 is able to swing about the center axis of supply pipeline 58. Since the distance from the axis of supply pipeline 58 to the end of nozzle 60 is approximately the same as the distance from the axis of supply pipeline 58 to the rotational center of turntable 50, and as a result of this, nozzle 60 is able to pass above the exact center of wafer W supported on turntable 50.

Figure 5:
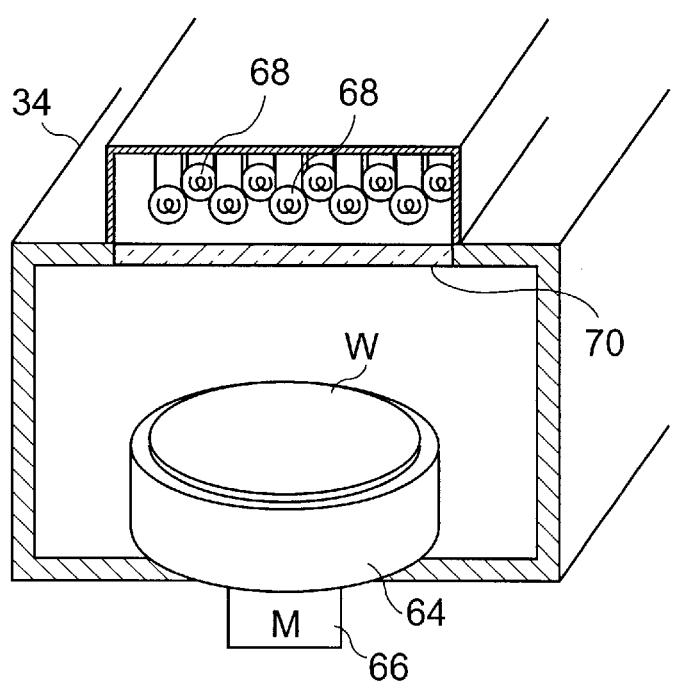
FIG. 5 is a schematic diagram showing the process chamber used for pyrolytic decomposition in the copper film deposition apparatus of FIG. 3.

Likewise, as shown in FIG. 5, turntable 64 is configured inside fourth process chamber 34 in order to hold wafer W in a manner such that it can be rotated. This turntable 64 has basically the same mechanism as turntable 50 in third process chamber 32, whereby it is rotated by drive motor 66 and can hold wafer W in place using an applicable means such as a vacuum chuck. However,turn table 64 rotates at a slower speed than turntable 50 in first process chamber 32. In addition, the diameter of turntable 64 is made larger than the diameter of wafer W. There are various reasons for this difference, including the fact that since a pyrolytic decomposition reaction of the organic metal on the surface of wafer W occurs in fourth process chamber 34, this difference allows the related reactions to occur more uniformly.

Above turntable 64, a plurality of heating lamps 68, which may be for example halogen lamps, are configured to be placed behind silica glass plate 70. This configuration allows the surface of the wafer W that is locked onto turntable 64 to be heated. Temperature control is achieved based on the signals output from temperature gages such as a thermoelectric couple attached to turntable 64 or a pyrometer configured on the ceiling of process chamber 34, and is performed by turning heating lamps 68 on and off, or regulating the amount of power input to them.

Although it is not shown in the Figures, it is noted here that a supply source of an inert gas such as a nitrogen gas is connected to each of third process chamber 32, fourth process chamber 34, second transfer chamber 36, and buffer chamber 28, respectively, so that the air inside each chamber may be changed into an inert gas atmosphere. In addition, each of the respective chambers inside film deposition apparatus 10 is connected to a vacuum pump. The driving of each chamber, the gas supply, and the driving of the transport robot all fall under the management of a control device not shown in the Figures.

Processing is performed in the following order when forming the layers as shown in FIG. 1c using this type of multi-chambered film deposition apparatus 10, according to the present invention.

To begin with, at the same time as a cassette holder 22, which contains wafers W on which have been formed a predetermined pattern of insulating film 2 on the copper interconnect layer 1, is set into load lock chamber 18, an empty cassette holder 24 is set inside the other load lock chamber 20. Next, the vacuum pump connected to each of the chambers is activated, and the pressure inside each chamber is adjusted. In particular, each of the chambers 32, 34, and 36 inside copper film deposition device 26, are made to have an inert gas environment at the normal atmospheric pressure level. Slit valve 40 is then opened, one wafer W is taken out of cassette holder 18 using transport robot 30, and it is transferred to first transfer chamber 12. Afterwards, slit valve 40 is closed, slit valve 42 is opened to allow wafer W to be placed at a predetermined position within process chamber 14, and locked in place.

Figure 1A:
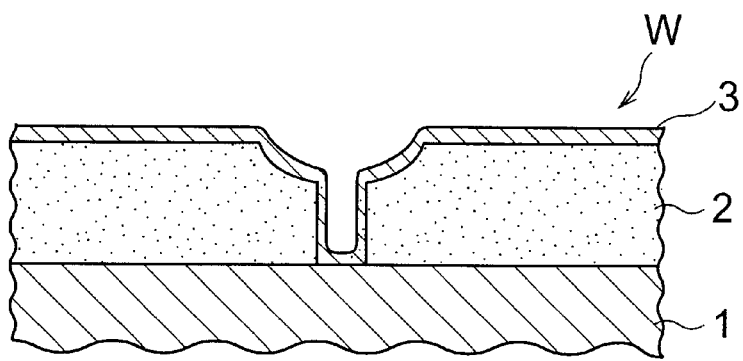
FIGS. 1a to 1c are partial cross-sectional views showing the state of the semiconductor wafer as diagrams that schematically illustrate steps of the film deposition method according to the present invention.

Once wafer W is set inside first process chamber 14, slit valve 42 is closed and the sputtering process is begun to form barrier metal layer 3 of, for example, Ta (FIG. 1a). This barrier metal layer 3 is formed so that the copper that is later deposited is prevented from diffusing into the lower layers.

Figure 1B:
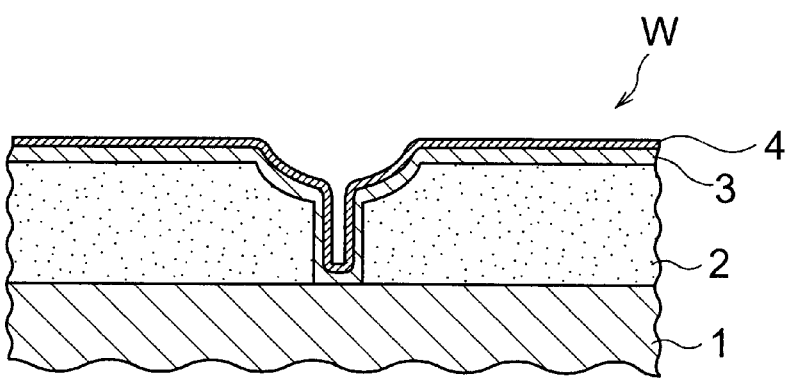

Next, in the same manner as above, the opening and closing of slit valves 42 and 43 and the activation of transport robot 30 is controlled in order to transfer wafer W into second process chamber 16 and lock it into a predetermined position. The copper sputtering process is performed inside second process chamber 16 to form copper thin film 4 on the surface of barrier metal 3 (FIG. 1b). This film 4 is referred to as a "seed layer", and functions as the seed or anchor of copper film 5, which is deposited in the next process, and also serves to improve wettability and compatibility with the process fluid that is applied. Accordingly, it is sufficient for this seed layer 4 to be made extremely thin; however, it is important that it cover the entire surface of barrier metal layer 3. From this standpoint, the copper seed layer may even be deposited using MOCVD, which provides superb step coverage, instead of the sputtering process.

Afterwards, slit valves 43 and 44 and transport robot 30 are controlled to transport wafer W from second process chamber 14, through transfer chamber 12, and into buffer chamber 28, and temporarily place it on wafer support 72. Slit valve 44 is then opened, and an inert gas such as nitrogen gas is introduced into buffer chamber 28.

It is noted here that copper film deposition device 26 and first transfer chamber 12 may also be directly connected without having to pass through buffer chamber 28. However, a problem may develop where each of the chambers 32, 34, and 36 inside copper film deposition device 26 are already made to have an inert gas environment near the normal atmospheric pressure level. In other words, if copper film deposition device 26 and first transfer chamber 12 are directly connected, then since the level of vacuum inside first transfer chamber 12 is so much higher, when the slit valve is opened it takes time for the pressure that was inside first transfer chamber 12, which was near normal atmospheric pressure, to return to what it was, which then in turn leads to a loss of processing time. Therefore, in this invention, small capacity buffer chamber 28 is provided between copper film deposition device 26 and first transfer chamber 12.

Once the inert gas is introduced and buffer chamber 28 reaches the predetermined pressure, slit valve 45 is opened and wafer W is transferred into transfer chamber 36 by transport robot 38, and then again transferred into third process chamber 32, placed onto turntable 50, and locked into place.

Next, while drive motor 52 is activated to rotate turntable 50 at a predetermined rotational speed, nozzle 60 is placed directly above the center of wafer W, process fluid flows from process fluid supply system 56 through supply pipeline 58 and nozzle 60, and is poured onto the front surface of wafer W. Since turntable 50 is rotating at a relatively high speed, the process fluid supplied onto wafer W spreads out towards its periphery due to centrifugal force in order to apply process fluid to the surface of wafer W. The rotational speed of turntable 50 is set depending on variables such as the viscosity of the process fluid and the amount supplied. At the same time, actuator 62 is activated causing nozzle 60 to swing at an appropriate frequency and speed so that process fluid can be applied across the entire surface of wafer W with uniform thickness and quality.

During the application of process fluid, since the process fluid has favorable wettability to seed layer 4, the process fluid smoothly flows into, for example, structures and contact holes. In addition, as this is occurring, in the case where the internal pressure of third process chamber 32 is set higher than normal atmospheric pressure, due to the effect of the gas pressure, coverage is improved so that holes are sure to be filled in with process fluid, thereby avoiding deficiencies such as the development of vacancies. Furthermore in such cases, since the temperature within third process chamber 32 is a temperature that is within the non-reactive range of $(hfac)Cu^{+1}(tmvs)$, preferably at room temperature, the process fluid that is applied can not precipitate copper film.

Once this application procedure is completed, the supply of process fluid is cut off, and while nozzle 60 returns to its original position, the rotation of turntable 50 is stopped. Slit valves 46 and 47 and transport robot 38 are then controlled to transport wafer W from third process chamber 32 through transfer chamber 36 and into fourth process chamber 34, place wafer W on the predetermined position of turntable 64, and lock it in place.

Figure 6:
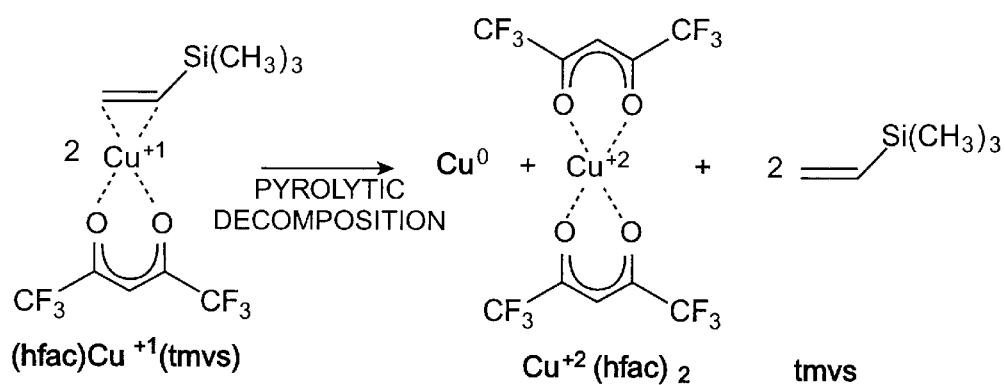
FIG. 6 illustrates the pyrolytic decomposition reaction of $(hfac)Cu^{+1}(tmvs)$.

Once wafer W is placed at the predetermined position, drive motor 66 is activated to rotate turntable 64, and at the same time, heating lamps are controlled to heat the surface of wafer W to a predetermined temperature, for example between 150° C. and 160° C. This causes the pyrolytic decomposition reaction of the $(hfac)Cu^{+1}(tmvs)$ within the process fluid that is applied to the surface of wafer W, which deposits a copper film on the surface of wafer W (FIG. 1c). The pyrolytic decomposition reaction of $(hfac)Cu^{+1}(tmvs)$ is shown in FIG. 6.

In this reaction, since the $Cu^{+2}(hfac)_2$ and tmvs that are created are vaporized due to the temperature within fourth process chamber 34 during the pyrolytic decomposition reaction, they are released from fourth process chamber 34 by the vacuum pump. The organic solvent heptadecane is also vaporized due to the temperature and released without leaving any trace on wafer W.

As described above, since the process fluid is applied across the entire surface of wafer W with nearly even layer thickness and quality, the copper film that is formed also has nearly even film thickness and quality. In addition, the fact that turntable 64 is rotated allows the unequal distribution of temperature resulting from the positioning of heating lamps 68 to be prevented, and in addition, allows the heat dissipation throughout wafer W to become fairly uniform as a result of the entire undersurface of wafer W being in contact with turntable 64. Accordingly, the pyrolytic decomposition reaction can occur uniformly throughout the entire wafer surface, further contributing to improved uniformity of layer thickness and quality. Moreover, the pressure inside fourth process chamber 34 is higher than normal air pressure, which also increases the boiling point of the process fluid. As a result, natural evaporation from the surface of the process fluid during the pyrolytic decomposition reaction is inhibited, thus yielding stable pyrolytic decomposition reaction.

Once the pyrolytic decomposition reaction process is completed, slit valves 47, 45, 44, and 41, transport robots 38 and 30, and the gas supply and release for buffer chamber 28 are controlled; wafer W is transported from fourth process chamber 34, through second transfer chamber 36, buffer chamber 28, and first transfer chamber 12, into load lock chamber 20; and it is stored in cassette holder 24 to complete one series of processing.

As described above, one series of processing, from the formation of barrier metal layer 3 until the formation of copper layer 5 is performed without exposure to air, thereby avoiding effects such as oxidation of the surface of wafer W, and obtaining a copper film having superb film quality and adhesiveness.

In the above, the preferred embodiment according to the present invention is described in detail; however, the present invention should not be considered as being limited to the embodiments described above. For example, the structure and layout of the film deposition apparatus, as long as none of the processing or transporting comes into contact with air, may have any number of appropriate alternatives, for example, the chamber provided for forming the seed layer is not always necessary. Furthermore, copper film deposition device 26 is not limited to the embodiment described above; alternatively, it may employ another format, for example it may even be an MOCVD device.

Furthermore, in the above embodiments, process fluid is fluid containing a mixture of a copper diketonate such as (hfac)Cu$^{+1}$(tmvs) and an aliphatic saturated hydrocarbon such as heptadecane; however, it is also feasible to have the organic metal be another copper diketonate such as (hfac)Cu$^{+1}$(teovs), or any other suitable organic metal than copper diketonate when performing film deposition of another material. Moreover, as the organic solvent for the copper diketonate, another aliphatic saturated hydrocarbon such as pentadecane, hexadecane, or octadecane may be used, and for organic metals besides copper diketonate, any other appropriate solvent maybe used. Furthermore, as described above, the process fluid may include only the organic metal.

INDUSTRIAL APPLICABILITY

As described above, since one series of processing, from the formation of the barrier metal layer through the formation of the metal layer is performed in an environment cutoff from air, a metal layer having low resistance and favorable layer quality may be obtained without the effects of natural oxidation.

Accordingly, the present invention contributes to improving the performance of semiconductor devices.

What is claimed is:

1. A film deposition method, comprising a step of barrier metal layer formation on a to-be-processed body; and a step of metal layer formation on said barrier metal layer; wherein one series of processing that is performed from said barrier metal layer formation up to and including said metal layer formation is performed under an environment shutoff from air, said metal layer formation including:
a first step of preparing a fluid, which contains an organometallic compound as its main component and which precipitates a metal layer material through a pyrolytic decomposition reaction,
a second step of applying said fluid onto said to-be-processed body at a temperature within the non-reactive range of said organometallic compound; and
a third step of heating said to-be-processed body to a predetermined temperature after said second step, and causing a pyrolytic decomposition reaction of said organometallic compound within said fluid that is applied to said to-be-processed body.

2. The film deposition method according to claim 1, wherein said barrier metal layer formation is performed by a first device; said metal layer formation is performed by a second device; and transportation of said to-be-processed body from said first device to said second device is performed through a transport pathway that is cut off from air.

3. The film deposition method according to claim 2, wherein a buffer chamber is prepared between said transport pathway and said second device, and wherein when transporting said to-be-processed body from said first device to said second device, after transporting said to-be-processed body from said transport pathway to said buffer chamber, said buffer chamber is cut off from said transport pathway, and then pressure inside said buffer chamber is pressurized to a predetermined pressure, and then said buffer chamber communicates with said second device to transport said to-be-processed body from said buffer chamber to said second device.

4. The film deposition method according to claim 3, wherein said barrier metal layer formation is performed at a predetermined degree of vacuum.

5. The film deposition method according to claim 1, wherein said barrier metal layer is formed using a sputtering process.

6. The film deposition method according to claim 1, wherein said metal layer is formed through a MOCVD process.

7. The film deposition method according to claim 1, wherein after formation of said barrier metal layer, a thin film of the same metal material as that of said metal layer on said barrier metal layer is formed as a seed layer.

8. The film deposition method according to claim 1, wherein said organometallic compound is copper diketonate and precipitates a copper.

9. The film deposition method according to claim 1, wherein pressure inside a process chamber that heats said to-be-processed body to cause pyrolytic decomposition reaction to occur during said third step is higher than normal atmospheric pressure in order to inhibit natural evaporation of said fluid.

10. The film deposition method according to claim 1, wherein said organometallic compound is selected from a group consisting of (hfac)Cu$^{+1}$(tmvs) and (hfac)Cu$^{+1}$(teovs).

11. A film deposition apparatus, comprising:
a first device, which forms a barrier metal layer in an environment that is cut off from air;
a second device, which forms a metal layer in an environment that is cut off from air; and
a transport pathway, which connects said first device and said second device, and is cut off from air,
said second device including:
a supply means for supplying fluid containing an organometallic compound as a main component that precipitates a metal layer material through a pyrolytic decomposition reaction;
an application means for applying said fluid that is supplied from said supply means onto a to-be-processed body;

a heating means for heating the to-be-processed body to a predetermined temperature.

12. The film deposition apparatus according to claim 11, wherein said first device is a sputtering device.

13. The film deposition apparatus according to claim 11, comprising a third device, which is an object connected to said transport pathway and which forms a thin layer made of the same metal material as that of said metal layer, as a seed layer in an environment cut off from air.

14. The film deposition apparatus according to claim 11, said second device includes a process chamber for locating the to-be-processed body therein, and an inert gas supply source for pressurizing pressure inside said process chamber to a predetermined pressure that is higher than normal atmospheric pressure in order to inhibit natural evaporation of said fluid that is applied to the to-be-processed body in said process chamber.

15. The film deposition apparatus according to claim 11, wherein said organometallic compound is selected from a group consisting of $(hfac)Cu^{+1}(tmvs)$ and $(hfac)Cu^{+1}(teovs)$.

16. The film deposition apparatus according to claim 11 further comprising a buffer chamber provided between said transport pathway and said second device.

17. A film deposition method comprising a barrier metal layer formation step of forming a barrier metal layer on a to-be-processed body; and a copper layer formation step of forming a copper layer on said barrier metal layer, said copper layer formation step including:
  a first step of preparing a fluid, which has as a main component an organometallic compound selected from a group consisting of $(hfac)Cu^{+1}(tmvs)$ and $(hfac)Cu^{+1}(teovs)$;
  a second step of applying said fluid onto said to-be-processed body at a temperature within the non-reactive range of said organometallic compound; and
  a third step of heating said to-be-processed body to a predetermined temperature after said second step, and causing a pyrolytic decomposition reaction of said organometallic compound within said fluid that is applied onto said to-be-processed body in order to form said copper layer on said to-be-processed body;

wherein pressure inside a process chamber that heats said to-be-processed body to cause pyrolytic decomposition reaction to occur during said third step is higher than normal atmospheric pressure in order to inhibit natural evaporation of said fluid.

* * * * *